United States Patent [19]
Moden

[11] Patent Number: 5,920,123
[45] Date of Patent: Jul. 6, 1999

[54] MULTICHIP MODULE ASSEMBLY HAVING VIA CONTACTS AND METHOD OF MAKING THE SAME

[75] Inventor: Walter L. Moden, Meridian, Id.

[73] Assignee: Micron Technology, Inc., Boise, Id.

[21] Appl. No.: 08/788,004

[22] Filed: Jan. 24, 1997

[51] Int. Cl.⁶ .............................. H01Z 23/16; H05K 3/34; H01L 23/02
[52] U.S. Cl. .................. 257/774; 257/779; 257/783; 257/784; 257/723; 257/698; 174/261; 174/260; 361/792; 361/760; 361/767; 29/832
[58] Field of Search ...................... 257/678, 774, 257/698, 668, 723, 784, 783, 786, 778, 777, 779; 29/832, 840; 174/260, 261; 361/760, 792, 767; 438/15, 67, 66, 107, 108, 109, 110

[56] References Cited

U.S. PATENT DOCUMENTS

| | | | |
|---|---|---|---|
| 3,888,639 | 6/1975 | Hastings et al. | 29/626 |
| 4,574,331 | 3/1986 | Smolley | 361/393 |
| 5,023,994 | 6/1991 | Bujattis et al. | 29/852 |
| 5,111,278 | 5/1992 | Eichelberger | 257/698 |
| 5,119,272 | 6/1992 | Ohyama et al. | 361/402 |
| 5,128,831 | 7/1992 | Fox et al. | 361/396 |
| 5,239,448 | 8/1993 | Perkins et al. | 361/764 |
| 5,353,194 | 10/1994 | Libretti | 361/707 |
| 5,394,298 | 2/1995 | Sagisaka | 361/704 |
| 5,450,290 | 9/1995 | Boyko et al. | 361/792 |
| 5,483,421 | 1/1996 | Gedney et al. | 174/260 |
| 5,487,218 | 1/1996 | Bhatt et al. | 29/852 |
| 5,527,741 | 6/1996 | Cole et al. | 438/107 |
| 5,535,101 | 7/1996 | Miles et al. | 367/808 |
| 5,615,477 | 4/1997 | Sweitzer | 29/840 |

*Primary Examiner*—Alexander Oscar Williams
*Attorney, Agent, or Firm*—Fletcher, Yoder & Van Someren

[57] ABSTRACT

A multichip module includes a printed circuit printed circuit board onto which traces of electrically conductive material are formed and into which groups of plated vias are formed. Each group of vias is associated with an integrated circuit to be mounted in the assembly and has a spacing pattern that is identical to the spacing pattern of the bond pads of the integrated circuit with which it is associated. A layer of insulative adhesive material is provided, one side of which is attached to the printed circuit board. A plurality of integrated circuits are attached to the other side of the adhesive material. Each of the integrated circuits has a plurality of bond pads in a spacing pattern. A conductive contact is disposed in each via to connect a bond pad to that via.

17 Claims, 2 Drawing Sheets

MULTICHIP MODULE ASSEMBLY HAVING VIA CONTACTS AND METHOD OF MAKING THE SAME

BACKGROUND OF THE INVENTION

1. Field of the Invention

The present invention relates in general to the field of integrated circuits and in particular to an assembly on which multiple integrated circuits may be mounted.

2. Description of the Related Art

As the demand for manufacturing electrical assemblies with greater densities has increased, various techniques have been developed to utilize the available area on the printed circuit boards used in such assemblies. One such technique known as chip-on-board (COB) eliminates the need for chip carriers or packages. The COB method involves mounting integrated circuit chips directly on the printed circuit board (PCB). During the mounting process the chip is first flipped over so that the bonding pad side faces downward. The chip is then mounted to the PCB board using a control-collapse-chip-connection (also known as C4). In the C4 process, the chip is connected to the PCB by interposing a plurality of interconnect bumps between the bond pads on the chip and a series of corresponding bump pads on the upper surface of the PCB. There is typically another series of bump pads and bumps on the underside of the PCB to connect the PCB to another component. The PCB includes plated through holes that connect the bottom bump pads to the top bump pads.

There are several disadvantages associated with the conventional COB method. First, the use of bumps elevates the chip above the PCB, leaving a gap as wide as the diameter of the bumps. If there are mismatches in the coefficients of thermal expansion of the chip and the PCB, thermal cycling may lead to stress failure of the bumps. In an attempt to alleviate the thermal stress problem, designers have dispensed underfil materials into the gap between the chip and the PCB. However, the underfil material must normally be applied after the chip is in place. This is a time consuming process that requires specialized equipment. In addition to subjecting the chip connection to potentially damaging thermal stresses, the conventional COB process requires time consuming and expensive processing steps and a dual-camera alignment system to form the bumps and bump pads.

SUMMARY OF THE INVENTION

In accordance with one aspect of the present invention, an integrated circuit carrier assembly for holding an integrated circuit having a bond pad is provided. The assembly includes a substrate that has a first side and a second opposing side. The substrate has a conductive trace coupled thereto and an opening formed therein. A conductive plate is disposed in the opening and is in electrical communication with the trace. A conductive contact is disposed in the opening and is in electrical communication with the conductive plate. An insulative adhesive layer is coupled to the substrate and an integrated circuit coupled to the insulative adhesive layer such that said bond pad is in electrical communication with the conductive contact.

In accordance with another aspect of the present invention, a multichip module assembly is provided. The multichip module includes a printed circuit board onto which traces of electrically conductive material are formed and into which groups of plated vias are formed. Each group of vias being is associated with an integrated circuit to be mounted in the assembly and has a spacing pattern identical to the spacing pattern of the bond pads of the integrated circuit with which it is associated. A layer of insulative adhesive material is provided, one side of which is attached to the printed circuit board. A plurality of integrated circuits are attached to the other side of the adhesive material. Each integrated circuit has a plurality of bond pads in a spacing pattern. A conductive contact is disposed in each via to connect a bond pad to that via.

In accordance with still another aspect of the present invention, a method of forming an assembly containing plurality of integrated circuits is provided. The method includes the steps of forming a plurality of groups of plated vias in a printed circuit board wherein each group of vias is associated with one of the integrated circuits in the assembly and the spacing pattern of the vias in each group corresponds to the spacing pattern of the bond pads on the integrated circuit with which said group of vias is associated. A plurality of traces of electrically conductive material are formed on the printed circuit board. A layer of insulative adhesive material is attached to one side of the printed circuit board. Each integrated circuit is attached to said insulative material such that the bond pads of the integrated circuit are aligned with the group of vias for that integrated circuit. Each via is filled with a conductive contact.

BRIEF DESCRIPTION OF THE DRAWINGS

The present invention will be better understood from reading the following description of embodiments, with reference to the attached drawings, wherein below.

DETAILED DESCRIPTION OF SPECIFIC EMBODIMENTS

Figure 1:
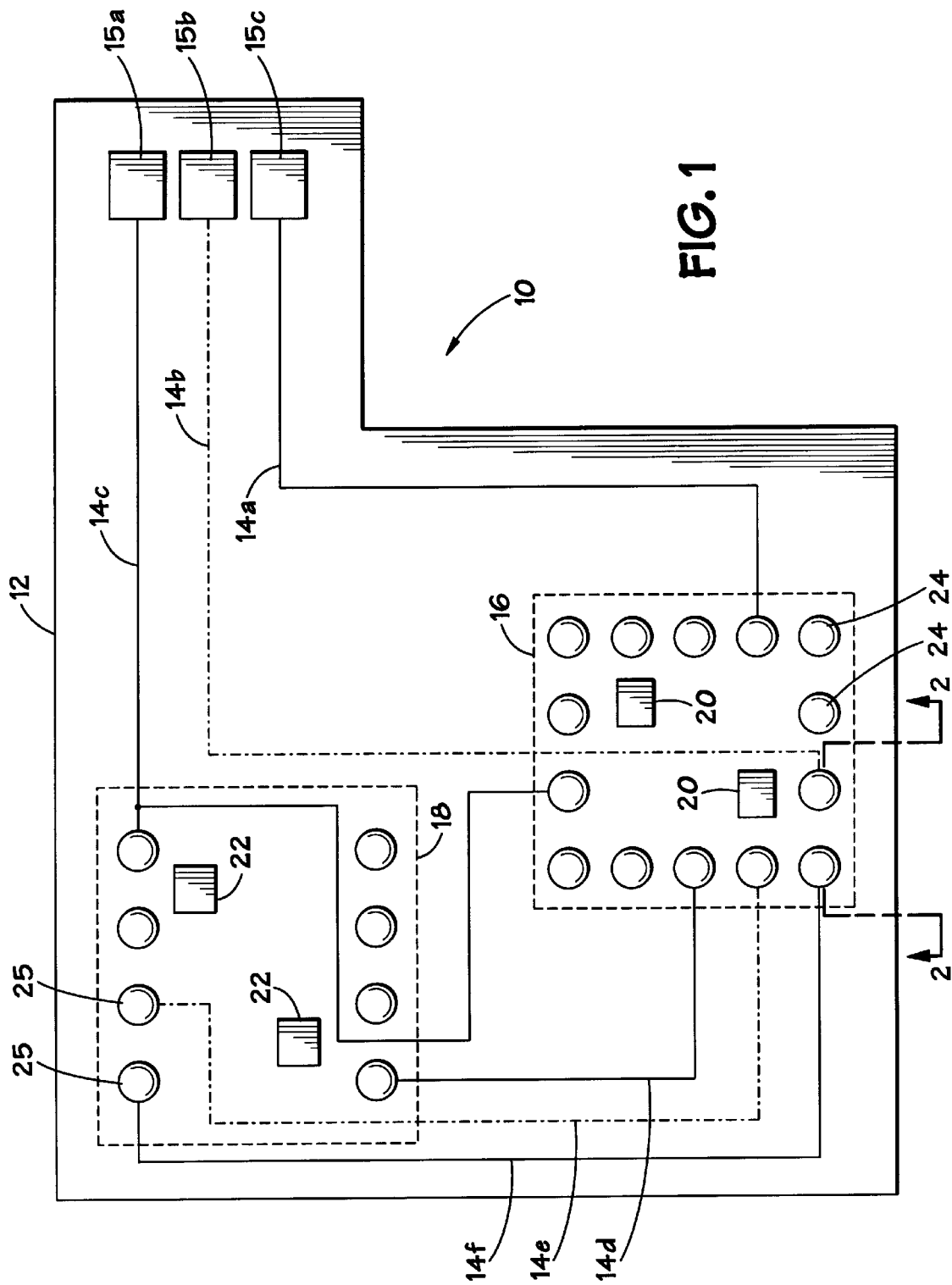
FIG. 1 is a top view of a multichip module assembly in accordance with the present invention.

Referring to FIG. 1, there is illustrated an embodiment of a multichip module assembly or integrated circuit carrier 10 in accordance with the present invention. The module assembly 10 includes a substrate 12 which may be in the form of a printed circuit board 12. The material from which the printed circuit board 12 is fabricated is a matter of design choice, depending on cost and environmental factors, and the printed circuit board 12 may for example be fabricated of FR4, polyimide or ceramic material.

While the multichip module assembly 10 as illustrated in FIG. 1 is designed to accommodate two integrated circuits or "chips" 16 and 18, it will be apparent that an assembly in accordance with the present invention may be designed to accommodate any number of integrated circuits. The dotted line that is used to designate the integrated circuits 16, 18 indicates that the integrated circuits are mounted on the underside of the printed circuit board 12.

Since the assembly illustrated in FIG. 1 is designed to accommodate two integrated circuits, two groups of openings or vias 24 and 25 are formed in printed circuit board 12. The group of vias designated 24 is associated with integrated circuit 16, while the group of vias designated 25 is associated with integrated circuit 18. The spacing and pattern of vias 24 correspond to the spacing and pattern of the bond pads on integrated circuit 16, while the spacing and pattern of vias 25 correspond to the spacing and pattern of the bond pads on integrated circuit 18. Also, alignment holes 20, 22 are formed in printed circuit board 12 for proper registering of integrated circuits 16 and 18, respectively, when the integrated circuits are installed as described below. The groups of vias 24 and 25 and the alignment holes 20 and 22 may be formed by conventional mechanical or laser drilling techniques.

One or both sides of printed circuit board 12 initially has a layer of electrically conductive material, e.g., copper or aluminum, disposed on it. Circuitization of this electrically conductive material will be dependent on the functions to be performed by the integrated circuits in assembly 10. Unwanted conductive material is removed by well-known processes, e.g., etching, to produce the desired circuitization. In FIG. 1, for example, the result of this circuitization process produces a plurality of traces of conductive material 14a–14f and output pads 15a–15c. The traces 14a, 14c, 14d and 14f are formed on the top side of printed circuit board 12, while the traces 14b and 14e are formed on the underside of printed circuit board 12.

Those skilled in the art will appreciate that the printed circuit board 12 may initially not contain any layer of conductive material and that the traces may be formed by plating or otherwise depositing conductor lines onto printed circuit board 12.

Figure 2:
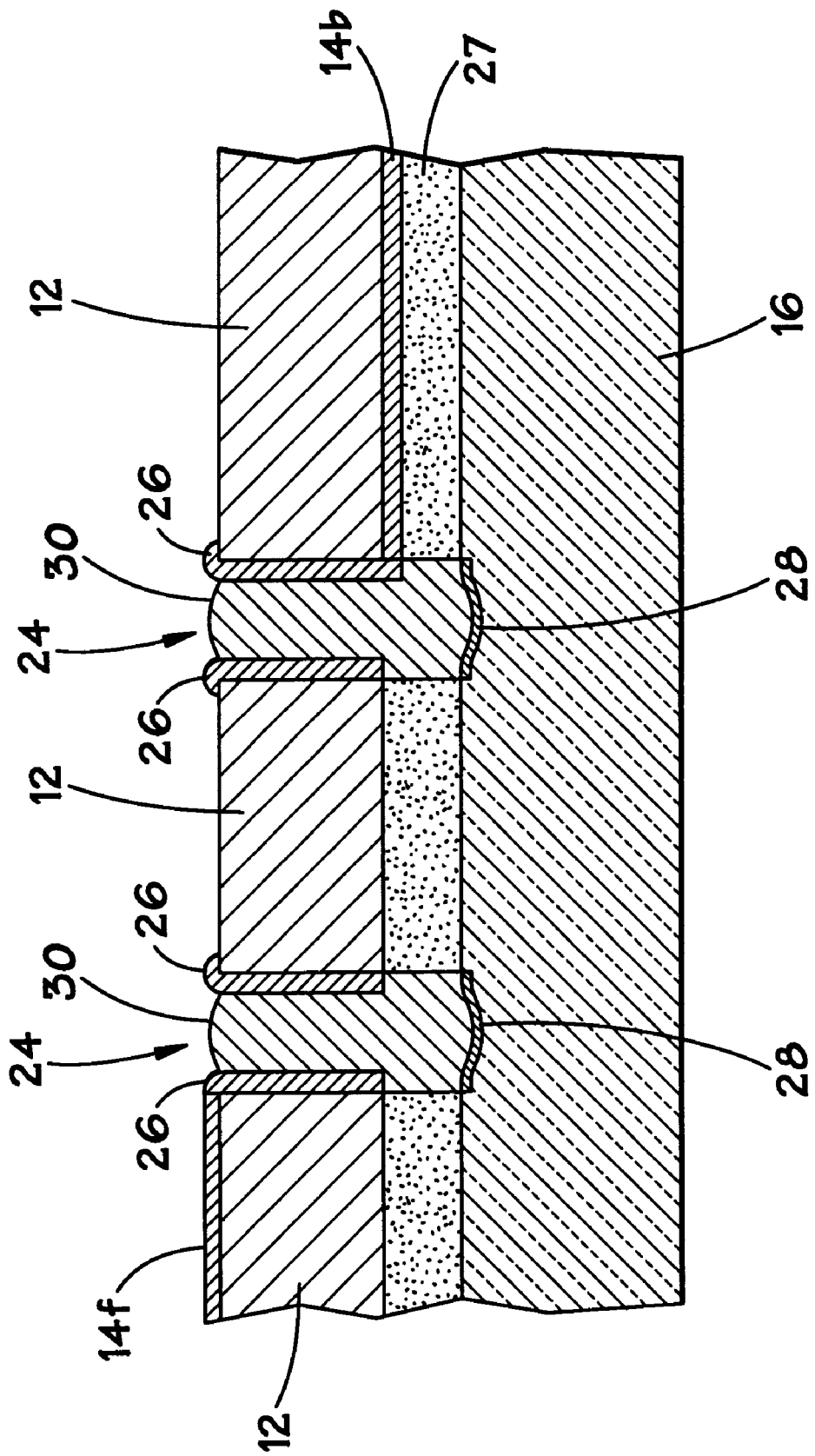
FIG. 2 is a cross-sectional view of a portion of the multichip module assembly of FIG. 1 taken at section 2—2.

With reference now to FIG. 2, after the circuitization process described above is completed, all vias 24 and 25 are thru-plated with an electrically conductive material to form plates 26 that have exterior surfaces that conform to the interior surfaces of the vias 24 and 25. A plating mask (not shown) is first placed over the printed circuit board 12, leaving the vias 24 and 25 exposed. The vias 24 and 25 are then plated using a conventional plating process, such as, for example, dip electroplating. The conductive material that is used to form the plates 26 in the vias 24 and 25 is preferably the same electrically conductive material used to form the traces 14a–f. The area of the plated vias 24, 25 should be less than or equal to the size of the bond pads on their respective associated integrated circuits.

An insulative adhesive layer 27 is then applied to the underside of printed circuit board 12 in those areas where the integrated circuits 16 and 18 will be mounted as shown in FIG. 2. Prior to application of the adhesive layer 27, a stencil (not shown) is applied to the printed circuit board 12 to cover the vias 24 and 25 and the alignment holes 20 and 22 and leave exposed those areas on the printed circuit board 12 where the integrated circuits 16 and 18 will be mounted. After the adhesive layer 27 is applied, the stencil is removed. The adhesive layer 27 may be made of a thermoplastic, thermoset or pressure sensitive material suitable for multichip module packaging applications and should be 2 mils or more in thickness to compensate for warping and wet out of the integrated circuit. The adhesive layer 27 is the primary mechanism by which each integrated circuit 16 and 18 is mechanically connected to the assembly. Because the adhesive layer 27 is applied before the integrated circuits 16 and 18 are mounted, traces may be applied to both the upper and lower surfaces of the printed circuit board 12 as shown in FIG. 2, without risk of short circuits.

Each integrated circuit 16, 18 is mounted to the insulative adhesive layer 27. The following description of the mounting and via filling processes for the integrated circuit 16 applies to all such integrated circuits. During the mounting process, the bonding pads 28 of the integrated circuit 16 are first aligned with the corresponding vias 24 on the printed circuit board 12 using the alignment holes 20 as guides. The integrated circuit 16 is then laid on the adhesive layer 27 as shown in FIG. 2. The entire alignment and mounting operation may be carried out on a conventional single-camera die attachment machine equipped with a pattern recognition system. The skilled artisan will appreciate that, unlike the conventional COB method, the alignment and mounting operation in accordance with the present invention requires a single camera alignment system.

The vias 24 are then filled with conductive contacts 30 to provide an electrical connection between the bond pads 28 of the integrated circuit 16, the plated vias 24 the traces 14f and 14b as shown in FIG. 2. The contacts 30 are formed from a conductive material, such as a conductive epoxy or a low melting temperature solder. If composed of conductive epoxy, the conductive contacts 30 are formed by conventional stencil printing or syringe dispensing techniques, and cured using the curing protocol recommended by the epoxy manufacturer. If solder is used, the conductive contacts 30 are formed by inverting the assembly shown in FIG. 2 and passing it through a wave soldering machine, such as those manufactured by Hollis Co. Prior to application of the conductive contacts 30, a stencil (not shown) is applied to the assembly 10 to expose the vias 24 and 25 while covering the remainder of the assembly 10. The stencil is removed after the soldering process.

The interface between the generally cylindrical exterior surface of the contacts 30, the interior surface areas of the plates 26, and the interior surfaces of the vias 24 and 25 provide a greater surface area for the transport of heat away from and for the transmission of current to and from the integrated circuits 16 and 18 than is possible with conventional bump pads.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

What is claimed is:

1. An integrated circuit carrier assembly for holding an integrated circuit having a bond pad, comprising:

a substrate having a first side and a second opposing side, said substrate having a conductive trace coupled thereto, said substrate having an opening formed therein;

a conductive plate disposed in said opening and being in electrical communication with said trace;

a conductive contact disposed in said opening and being in electrical communication with said conductive plate;

an insulative adhesive layer coupled to said substrate; and an integrated circuit coupled to said insulative adhesive layer such that said bond pad is in electrical communication with said conductive contact.

2. The integrated circuit carrier assembly of claim 1, comprising a first conductive trace coupled to said first side of said substrate and a second conductive trace coupled to said second side of said substrate.

3. The integrated circuit carrier assembly of claim 1, wherein said conductive contact comprises conductive epoxy.

4. The integrated circuit carrier assembly of claim 1, wherein said conductive contact comprises solder.

5. The integrated circuit carrier assembly of claim 1, wherein said substrate comprises an alignment opening to facilitate placement of said integrated circuit.

6. A multichip module assembly comprising:

a printed circuit board onto which traces of electrically conductive material are formed and into which groups of plated vias are formed, each group of vias being associated with an integrated circuit to be mounted in the assembly and having a spacing pattern identical to the spacing pattern of the bond pads of the integrated circuit with which it is associated;

a layer of insulative adhesive material, one side of which is attached to the printed circuit board;

a plurality of integrated circuits that are attached to the other side of the adhesive material, each said integrated circuit having a plurality of bond pads in a spacing pattern; and a conductive contact disposed in each via to connect a bond pad to that via, said conductive contact comprising one of conductive epoxy and solder.

7. The integrated circuit carrier assembly of claim 6, wherein said printed circuit board having a first side and a second opposing side, said traces being formed on said first side and said second side.

8. The integrated circuit carrier assembly of claim 6, wherein said printed circuit board substrate comprises an alignment opening for each of said group of vias to facilitate placement of said integrated circuit.

9. A method of forming an assembly containing at least one integrated circuit, comprising the steps of:

forming a plurality of groups of plated vias in a printed circuit board, each said group of vias being associated with one of the integrated circuits in the assembly and the spacing pattern of the vias in each group corresponding to the spacing pattern of the bond pads on the integrated circuit with which said group of vias is associated;

forming a plurality of traces of electrically conductive material on the printed circuit board;

attaching a layer of insulative adhesive material to one side of the printed circuit board;

attaching said at least one integrated circuit to said insulative material such that the bond pads of said at least one integrated circuit are aligned with the group of vias for that integrated circuit; and filling each via with a conductive material.

10. The method of claim 9, wherein said conductive material comprises a conductive epoxy.

11. The method of claim 9, wherein said conductive material comprises a solder.

12. A multichip module assembly comprising:

an integrated circuit having a plurality of bond pads in a spacing and pattern;

a printed circuit board carrying traces of electrically conductive material and having at least one group of plated vias there through, said at least one group of vias being associated said integrated circuit to be mounted in the assembly and having a spacing and pattern identical to the spacing and pattern of bond pads said integrated circuit, said vias of said at least one group and said bond pads of said integrated circuit being in substantial registration;

a layer of non-conductive adhesive material, indisposed between said provided circuit board and said integrated circuit; and a conductive material disposed in each via in contact with a bond pad substantially registered therewith, said conductive material comprising one of conductive epoxy and solder.

13. The integrated circuit carrier assembly of claim 12, wherein said printed circuit board having a first side and a second opposing side, said traces being formed on said first side and said second side.

14. The integrated circuit carrier assembly of claim 12, wherein said printed circuit board substrate comprises an alignment opening for each of said group of vias to facilitate placement of said integrated circuit.

15. A method of forming an assembly containing at least one integrated circuit comprising:

forming at least one group of plated vias through said printed circuit board providing a printed circuit board having a plurality of traces of electrically conductive material thereon, said at least one group of vias being associated with one of the integrated circuits in the assembly and the spacing and pattern of the at least one group of vias corresponding to the spacing and pattern of the bond pads on the integrated circuit with which said at least one group of vias is associated;

attaching a layer of insulative adhesive material to one side of the printed circuit board;

attached said at least one integrated circuit to the insulative material such that the bond pads of said at least one integrated circuit are aligned with the group of vias for that integrated circuit; and filling each via with a conductive material.

16. The method of claim 15, wherein said conductive material comprises a conductive epoxy.

17. The method of claim 15, wherein said conductive material comprises a solder.

* * * * *